US012805369B2

(12) United States Patent
Ejiri et al.

(10) Patent No.: US 12,805,369 B2
(45) Date of Patent: Nov. 17, 2026

(54) SOLDER PASTE, METHOD FOR FORMING SOLDER BUMPS, AND METHOD FOR PRODUCING MEMBER WITH SOLDER BUMPS

(71) Applicant: Resonac Corporation, Tokyo (JP)

(72) Inventors: Yoshinori Ejiri, Tokyo (JP); Shinichirou Sukata, Tokyo (JP); Kunihiko Akai, Tokyo (JP); Masumi Sakamoto, Tokyo (JP); Chiaki Shimizu, Tokyo (JP); Junichi Kakehata, Tokyo (JP); Ayumi Yoshiba, Tokyo (JP)

( * ) Notice: Subject to any disclaimer, the term of this patent is extended or adjusted under 35 U.S.C. 154(b) by 416 days.

(21) Appl. No.: 18/263,711

(22) PCT Filed: Feb. 3, 2021

(86) PCT No.: PCT/JP2021/003966
§ 371 (c)(1),
(2) Date: Aug. 28, 2023

(87) PCT Pub. No.: WO2022/168209
PCT Pub. Date: Aug. 11, 2022

(65) Prior Publication Data
US 2024/0105653 A1 Mar. 28, 2024

(51) Int. Cl.
*H10W 72/00* (2026.01)
*H10W 70/05* (2026.01)
(Continued)

(52) U.S. Cl.
CPC ....... *H10W 72/071* (2026.01); *H10W 70/093* (2026.01); *H10W 72/01265* (2026.01);
(Continued)

(58) Field of Classification Search
CPC ..... H01L 24/11; H01L 21/4853; H01L 21/60; H01L 24/13; H01L 24/16; H01L 24/81;
(Continued)

(56) References Cited

U.S. PATENT DOCUMENTS 5,591,037 A * 1/1997 Jin .......................... H10P 72/74
228/56.3
2004/0000355 A1 1/2004 Suga et al.
(Continued)

FOREIGN PATENT DOCUMENTS

CN 108025402 5/2018
JP 2000-031632 1/2000
(Continued)

OTHER PUBLICATIONS

International Search Report dated Apr. 13, 2021 for PCT/JP2021/003966.

(Continued)

*Primary Examiner* — Julia Slutsker
(74) *Attorney, Agent, or Firm* — SHIPWAY IP

(57) ABSTRACT

A method for forming solder bumps by using a solder paste containing solder particles, a flux, and a volatile dispersion medium, the method including: applying the solder paste on a member having a plurality of electrodes on the surface; heating the member and the solder paste at a temperature below the melting point of solder constituting the solder particles to form a solder particle-containing layer; heating the member and the solder particle-containing layer at a temperature equal to or higher than the melting point of the solder constituting the solder particles to form solder bumps; and removing, by cleaning, a residue of the solder particle-containing layer remaining between adjacent solder bumps, in which the solder particles have an average particle size of
(Continued)

10 μm or less, and the content of the dispersion medium in the solder paste is 30% by mass or more.

11 Claims, 10 Drawing Sheets

(51) Int. Cl.
*H10W 72/20* (2026.01)
*H10W 90/00* (2026.01)

(52) U.S. Cl.
CPC .... *H10W 72/01271* (2026.01); *H10W 72/072* (2026.01); *H10W 72/07211* (2026.01); *H10W 72/07236* (2026.01); *H10W 72/242* (2026.01); *H10W 72/247* (2026.01); *H10W 90/724* (2026.01)

(58) Field of Classification Search
CPC ... H01L 2021/6024; H01L 2224/13023; H01L 2224/81024; H01L 2224/81801; H01L 2224/81; H05K 3/34; H10W 72/071; H10W 70/093; H10W 72/01265; H10W 72/01271; H10W 72/072; H10W 72/07211; H10W 72/07236; H10W 72/242; H10W 72/247; H10W 90/724; H10W 72/0112; H10W 72/012; H10W 72/232; H10W 72/20
See application file for complete search history.

(56) References Cited

U.S. PATENT DOCUMENTS

2005/0133572 A1* 6/2005 Brese ...................... H01L 24/13 257/E21.511
2007/0216023 A1* 9/2007 Nakatani ................. H01L 24/11 257/714
2008/0085595 A1 4/2008 Li
2014/0030848 A1* 1/2014 Ikemoto .................. C08L 63/00 523/427
2017/0368643 A1 12/2017 Gu et al.
2018/0056448 A1* 3/2018 Hayashi .................. C22C 13/00
2022/0139864 A1* 5/2022 Nitta .......................... C09J 9/02 257/734

FOREIGN PATENT DOCUMENTS

JP 2002-134538 5/2002
JP 2007-123558 5/2007
JP 4055556 3/2008
JP 2008-545257 12/2008
JP 2009-231581 10/2009
JP 2012-004347 1/2012
JP 5657761 1/2015
JP 2019-025546 2/2019
JP 2020-198394 12/2020
KR 10-2014-0084095 7/2014
WO 2006/095417 9/2006

OTHER PUBLICATIONS

International Preliminary Report on Patentability with Written Opinion dated Aug. 17, 2023 for PCT/JP2021/003966.
International Search Report dated Apr. 13, 2021 for PCT/JP2021/003963.
International Preliminary Report on Patentability with Written Opinion dated Aug. 17, 2023 for PCT/JP2021/003963.
SOEI Intellectual Property Law, Statement of Related Matters, dated Feb. 18, 2026.

* cited by examiner (a)

(b)

(a)

(b)

(c)

(a)

(b)

(a)

(b)

SOLDER PASTE, METHOD FOR FORMING SOLDER BUMPS, AND METHOD FOR PRODUCING MEMBER WITH SOLDER BUMPS

TECHNICAL FIELD

The present invention relates to a solder paste, a method for forming solder bumps, and a method for producing a member with solder bumps.

BACKGROUND ART

Regarding a method for packaging an electronic component on an electronic member, there is known a method of having the surface of an electrode coated in advance with solder, subsequently mounting an electronic component on an electronic member, and then joining them (solder precoating method).

As the solder precoating method, for example, there is known a method of applying a solder paste on an area where electrodes are arranged on an electronic member (for example, the entire surface of the electronic member) and heating the solder paste to form solder bumps on the individual electrodes (see, for example, Patent Literature 1).

CITATION LIST

Patent Literature

Patent Literature 1: Japanese Unexamined Patent Publication No. 2012-4347

SUMMARY OF INVENTION

Technical Problem

In recent years, as electronic instruments are becoming smaller in size and lighter in weight, the pitch between electrodes on a member on which electronic components are packaged (for example, an electronic member such as an electronic circuit board) has become narrower, and for example, the gaps between electrodes have become less than 25 μm.

As a result of studies conducted by the inventors of the present invention, it has been found that when solder bumps are formed by the method described in Patent Literature 1 on a member having narrow gaps between electrodes as described above, a phenomenon called "bridging" occurs in which adjacent electrodes are connected by molten solder in the gaps between the electrodes, resulting in a short circuit, or a phenomenon called "solder dewetting" occurs in which an electrode surface is not sufficiently coated with solder, resulting in defective shapes of solder bumps.

Thus, according to an aspect of the present invention, it is an object of the invention to provide a method for forming solder bumps while suppressing the occurrence of bridging and solder dewetting even when the gaps between electrodes are narrow (for example, less than 25 μm), a solder paste used for the above-described method, and a method for producing a member with solder bumps by using the above-described method.

Solution to Problem

The inventors of the present invention conducted thorough investigations so as to achieve the above-described object, and as a result, the inventors found that when solder bumps are formed by a method of using a solder paste obtained by combining very fine solder particles and a flux and incorporating a large amount of a dispersion medium as compared with conventional solder pastes, and before heating to melt solder, performing heating to volatilize the dispersion medium to form a layer containing solder particles (solder particle-containing layer), the occurrence of bridging and the occurrence of solder dewetting can be suppressed, thus completing the present invention.

An aspect of the present invention relates to a method for forming bumps as described in the following [1].

[1] A method for forming solder bumps by using a solder paste containing solder particles, a flux, and a volatile dispersion medium, the method including: a step of applying the solder paste in an area of a member having a plurality of electrodes on a surface, the area having the electrodes disposed therein; a step of heating the member and the solder paste at a temperature $T_1$ below a melting point of solder constituting the solder particles to volatilize the dispersion medium in the solder paste, and forming a solder particle-containing layer on the member; a step of heating the member and the solder particle-containing layer at a temperature $T_2$ equal to or higher than the melting point of the solder constituting the solder particles to melt the solder particles in the solder particle-containing layer, and forming solder bumps on the electrodes of the member; and a step of removing, by cleaning, a residue of the solder particle-containing layer remaining between adjacent ones of the solder bumps, in which the solder particles have an average particle size of 10 μm or less, and a content of the dispersion medium in the solder paste is 30% by mass or more.

According to the method for forming solder bumps of the above-described aspect, even when the gaps between electrodes are narrow (for example, less than 25 μm), solder bumps can be formed while suppressing the occurrence of bridging and solder dewetting.

The method for forming solder bumps of the above-described aspect may be a method as described in the following [2] to [8].

[2] The method for forming solder bumps according to [1], in which the solder constituting the solder particles has a melting point of 180° C. or lower.

[3] The method for forming solder bumps according to [1] or [2], in which a content of the solder particles is 50% by mass or less.

[4] The method for forming solder bumps according to any one of [1] to [3], in which a content of the flux is 10 parts by mass or less with respect to 100 parts by mass of the solder particles.

[5] The method for forming solder bumps according to any one of [1] to [4], in which the average particle size of the solder particles is equal to or less than one-third of the distance between adjacent electrodes among the plurality of electrodes.

[6] The method for forming solder bumps according to any one of [1] to [5], in which the temperature $T_1$ is 50° C. or higher.

[7] The method for forming solder bumps according to any one of [1] to [6], in which the solder particle-containing layer has a thickness equal to or less than two-thirds of the distance between adjacent electrodes among the plurality of electrodes.

[8] The method for forming solder bumps according to any one of [1] to [7], in which the member is a semiconductor substrate having a plurality of electrodes on a surface.

Another aspect of the present invention relates to a method for producing a member with solder bumps as described in the following [9].

[9] A method for producing a member with solder bumps, the method including a step of forming solder bumps by the method according to any one of [1] to [8].

Another aspect of the present invention relates to a solder paste as described in the following [10].

[10] It relates to a solder paste containing solder particles, a flux, and a volatile dispersion medium, in which the solder particles have an average particle size of 10 μm or less, and a content of the dispersion medium is 30% by mass or more.

According to the solder paste of the above-described aspect, when solder bumps are formed by a method of performing, before heating to melt solder, heating to volatilize the dispersion medium to form a layer containing solder particles (solder particle-containing layer), even in a case where the gaps between electrodes are narrow (for example, less than 25 μm), solder bumps can be formed while suppressing the occurrence of bridging and solder dewetting.

The solder paste of the above-described aspect may be a solder paste as described in the following to [15].

[11] The solder paste according to [10], in which the solder constituting the solder particles has a melting point of 180° C. or lower.

[12] The solder paste according to or [11], in which a content of the solder particles is 50% by mass or less.

[13] The solder paste according to any one of to [12], in which a content of the flux is 10 parts by mass or less with respect to 100 parts by mass of the solder particles.

[14] The solder paste according to any one of to [13], in which the solder paste is used to form solder bumps on electrodes of a member having a plurality of electrodes on a surface, by a solder precoating method.

[15] The solder paste according to [14], in which the average particle size of the solder particles is equal to or less than one-third of a distance between adjacent electrodes among the plurality of electrodes.

Advantageous Effects of Invention

According to an aspect of the present invention, even when the gaps between electrodes are narrow (for example, less than 25 μm), solder bumps can be formed while suppressing the occurrence of bridging and solder dewetting.

DESCRIPTION OF EMBODIMENTS

Figure 1:
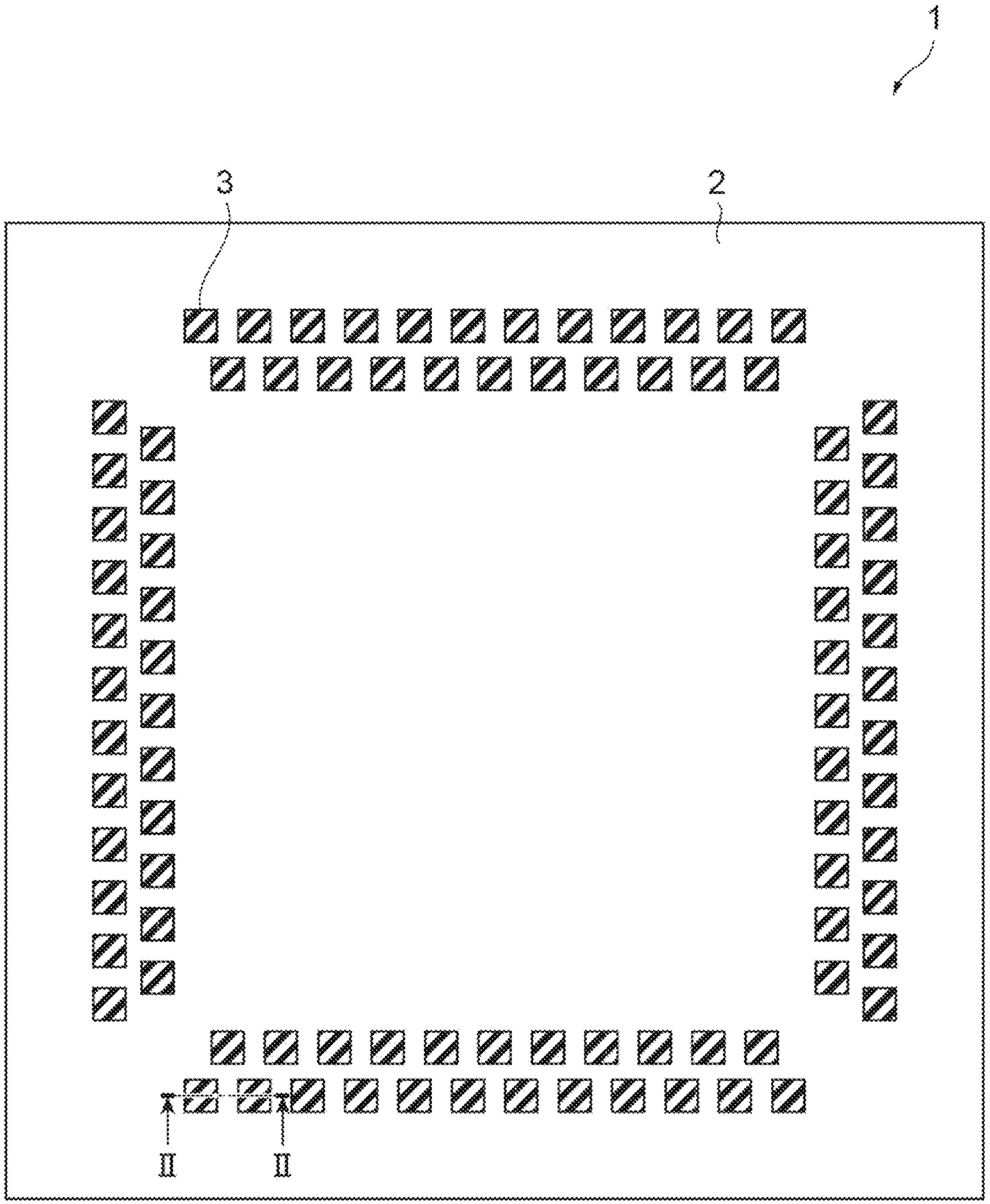
FIG. 1 is a schematic plan view illustrating an example of a member to which a method for forming solder bumps according to an embodiment is applied.

In the present specification, a numerical value range expressed using the term "to" represents a range including the numerical values described before and after the term "to" as the minimum value and the maximum value, respectively. With regard to a numerical value range described stepwise in the present specification, the upper limit value or lower limit value of a numerical value range of a certain stage may be replaced with the upper limit value or lower limit value of a numerical value range of another stage. Furthermore, with regard to a numerical value range described in the present specification, the upper limit value or lower limit value of the numerical value range may be replaced with a value shown in the Examples. Furthermore, the upper limit values and lower limit values described individually can be arbitrarily combined. Furthermore, in the present specification, the term "(meth)acryl" means at least one of acryl and methacryl corresponding thereto. Furthermore, "A or B" may include either one of A and B or may include both. Furthermore, unless particularly stated otherwise, the materials listed as examples below may be used singly or two or more kinds thereof may be used in combination. The content of each component in a composition means, when a plurality of substances corresponding to each component are present in the composition, the total amount of the plurality of substances present in the composition, unless particularly stated otherwise. Furthermore, the melting point and the boiling point mean values at 1 atmosphere.

Embodiments for carrying out the present invention will be described in detail below. However, the present invention is not intended to be limited to the following embodiments.

<Solder Paste>

A solder paste according to an embodiment is a solder paste used to form, for example, solder bumps on the electrodes of a member having a plurality of electrodes (for example, an electronic member such as a circuit member) on the surface by a solder precoating method and contains solder particles, a flux, and a volatile dispersion medium.

In the present embodiment, the average particle size of the solder particles is 10 μm or less, and the content of the dispersion medium (content based on the total mass of the solder paste) is 30% by mass or more. According to the solder paste of the present embodiment having such a configuration, as will be described below, by using a method of removing the dispersion medium on the member and then heating the solder paste at a temperature equal to or higher than the melting temperature of the solder particles, solder bumps can be formed while suppressing the occurrence of bridging and solder dewetting, even when the gaps between electrodes are narrow (for example, less than 25 μm).

The inventors of the present invention presume the reason why the above-described effect is obtained is as follows.

First, it is known that in the solder particles, tin exists in bulk and is exposed at the particle surface; however, since tin exposed at the particle surface is easily oxidized, tin oxide is formed in at least a portion (upper part of tin in bulk) of the surface of the solder particles. When such solder particles having a structure in which tin in bulk is covered with tin oxide are heated to a temperature equal to or higher than the melting point of solder, since the inner part of the solder particles melts whereas tin oxide at the outermost surface does not easily melt, it is speculated that growth of solder particles induced by melt fusion between solder particles is less likely to occur. Therefore, it is speculated that when the average particle size of the solder particles is as small as 10 μm or less, the proportion of tin oxide increases due to an increase in the specific surface area, which makes the growth of the solder particles further less likely to occur, and bridging due to melting of the solder particles remaining between the solder bumps is easily suppressed. Incidentally, even when tin on the solder particle surface is oxidized, the solder particles on the electrodes easily react with the metal on the electrode surface due to the effect of the flux, and tin can easily wet and spread on the electrode surface. For example, when the electrodes are Au electrodes, as an AuSn alloy layer is formed at the outermost layer of an Au electrode, tin can easily wet and spread on the surface of the Au electrode. Since the surface of wettingly spread tin is not oxidized due to the effect of the flux, an effect of melting an oxide film on the surface of the solder particles present on the electrodes or in the vicinity thereof is obtained, and the solder particles selectively melt, starting from the solder particles in the vicinity of the electrodes. As a result, it is believed that it is possible to selectively melt the solder particles on the electrodes or in the vicinity of the electrodes, and by suppressing the occurrence of bridging, solder bumps can be formed.

Furthermore, when the thickness of the solder particle-containing layer becomes non-uniform, and partially thick places are generated, bridging is likely to occur at those places, and it is believed that wetting and spreading of solder on the electrode surface is likely to be inhibited; however, when the content of the dispersion medium is 30% by mass or more, it is speculated that the thickness of the solder particle-containing layer deposited on the electrodes and between the electrodes is likely to be uniform, consequently resulting in suppression of the occurrence of bridging and solder dewetting.

(Solder Particles)

Solder particles include tin. The solder particles may include simple substance of tin or may include a tin alloy. Examples of the tin alloy include alloys based on In—Sn, In—Sn—Ag, Sn—Bi, Sn—Bi-Ag, Sn—Ag—Cu, and Sn—Cu. Regarding the solder particles, one kind thereof may be used alone, or two or more kinds thereof may be used in combination.

Specific examples of the tin alloy will be shown below.

In—Sn (In: 52% by mass, Sn: 48% by mass, melting point: 118° C.)

In—Sn—Ag (In: 20% by mass, Sn: 77.2% by mass, Ag: 2.8% by mass, melting point: 175° C.)

Sn—Bi (Sn: 42% by mass, Bi: 58% by mass, melting point: 138° C.)

Sn—Bi—Ag (Sn: 42% by mass, Bi: 57% by mass, Ag: 1% by mass, melting point: 139° C.)

Sn—Ag—Cu (Sn: 96.5% by mass, Ag: 3% by mass, Cu: 0.5% by mass, melting point: 217° C.)

Sn—Cu (Sn: 99.3% by mass, Cu: 0.7% by mass, melting point: 227° C.)

The content of tin in the solder particles may be, for example, 40% by mass or more, 60% by mass or more, or 80% by mass or more and may be 99.5% by mass or less, 80% by mass or less, or 60% by mass or less.

Tin in the solder particles exists, for example, in bulk (purity 99.9% or more). Since tin is a metal that is easily oxidized, usually, the solder particles include tin oxide in at least a portion of the surface (for example, upper part of tin in bulk).

The melting point of solder (melting point of solder constituting the solder particles) may be 250° C. or lower or 220° C. or lower, and from the viewpoint that solder bumps can be formed at low temperatures and the load on the member where solder bumps are formed can be reduced, the melting point may be 180° C. or lower, 160° C. or lower, or 140° C. or lower. The melting point of solder may be, for example, 100° C. or higher so that solder does not melt when the dispersion medium is volatilized. Incidentally, the melting point of solder can be said differently as the melting point of solder particles before oxidation.

From the viewpoint of further suppressing the occurrence of bridging, the average particle size of the solder particles may be 9.0 μm or less, 8.0 μm or less, 5.0 μm or less, 3.0 μm or less, or 2.0 μm or less. As the average particle size of the solder particles is smaller, the occurrence of bridging tends to be suppressed.

For example, from the viewpoint that the solder can be uniformly melted when heating the solder particles to a temperature equal to or higher than the melting point of solder, the average particle size of the solder particles may be 0.1 μm or more, 0.3 μm or more, 0.5 μm or more, 1.0 μm or more, or 2.0 μm or more.

The average particle size of the solder particles may be set according to the distance between adjacent electrodes on the member where the solder paste is applied. Specifically, when the average particle size of the solder particles is equal to or less than one-third of the distance between adjacent electrodes, the occurrence of bridging tends to be further suppressed. From the viewpoint of obtaining this tendency more remarkably, the average particle size of the solder particles may be equal to or less than one-fourth, or equal to or less than one-fifth, of the distance between adjacent electrodes.

The maximum diameter of the solder particles may be 1.0 μm or more or 2.0 μm or more, and may be 10 μm or less, 9.0 μm or less, 8.0 μm or less, 5.0 μm or less, 3.0 μm or less, or 2.0 μm or less. As the variation of the particle size of the solder particles is smaller, it is easy to uniformly melt the solder particles on the electrodes of the member, and the shape of the bumps is likely to be further improved. Furthermore, as the variation of the particle size of the solder particles is smaller, the occurrence of bridging due to melting of the solder particles remaining between the solder bumps is easily suppressed, and the occurrence of bridging caused by large-sized solder particles is easily suppressed. From these viewpoints, the proportion of the solder particles having the above-described maximum diameter may be 80% by mass or more, 90% by mass or more, or 95% by mass or more.

The maximum diameter and the average particle size of the solder particles can be calculated, for example, from SEM images by the following procedure. A powder of solder particles is placed on a carbon tape for SEM with a spatula, and this is used as a sample for SEM. This sample for SEM is observed at a magnification of 5000 times by using a SEM apparatus, and a SEM image is obtained. From the obtained SEM image, a rectangle circumscribing a solder particle is drawn by means of image processing software, and the long side of the rectangle is taken as the maximum diameter of the particle. This measurement is performed for 50 or more solder particles by using a plurality of SEM images, the average value of the maximum diameters of these solder particles is calculated, and this is defined as the average particle size (average maximum diameter). The maximum diameter and the average particle size of the solder particles in the solder paste can be determined by the above-described method after cleaning the solder particles using an organic solvent such as acetone, performing filtration, and drying the solder particles at normal temperature (for example, 25° C.).

The shape of the solder particles may be, for example, a spherical shape, a lumpy shape, a needle shape, a flat shape (flake shape), or an approximately spherical shape. The solder particles may be aggregates of solder particles having these shapes. Among these, when the solder particles have a spherical shape, the solder particles are likely to be uniformly dispersed on the electrodes and between the electrodes of the member (particularly, on the electrodes of the member). As a result, a solder particle-containing layer obtainable by drying the solder paste is formed uniformly on the electrodes and between the electrodes of the member, and when the solder particle-containing layer is heated to a temperature equal to or higher than the melting point of solder, the solder particles located in the upper part of the electrodes are likely to melt preferentially, as compared with the solder particles located between the electrodes, due to the effect of the flux. As a result, an effect that the occurrence of bridging is more easily suppressed and solder bumps having a more satisfactory shape are likely to be formed, is achieved. Here, a spherical-shaped solder particle refers to a particle having an aspect ratio (long side of particle/short side of particle) of 1.3 or less, which is determined from the above-described SEM image.

The content of the solder particles in the solder paste is less than 70% by mass based on the total mass of the solder paste. From the viewpoint that as the solder particle-containing layer is likely to be formed uniformly on the electrodes and between the electrodes of the member, the shape of the bumps in the upper part of the electrodes is made uniform, and the height and shape of the bumps are likely to be even, and from the viewpoint that as it is easy to disperse the solder particles uniformly between the electrodes, making it difficult for the solder particles between the electrodes to melt, the occurrence of bridging between the electrodes is further suppressed, the content of the solder particles may also be 65% by mass or less, 60% by mass or less, or 50% by mass or less. From the viewpoint of suppressing settling of the solder particles in the paste and improving the uniformity of the solder paste during application, the content of the solder particles in the solder paste may be 5% by mass or more, 10% by mass or more, 20% by mass or more, 30% by mass or more, 40% by mass or more, or 50% by mass or more, based on the total mass of the solder paste.

(Flux)

As the flux, one that is generally used for solder joints and the like can be used. Specific examples thereof include zinc chloride, a mixture of zinc chloride and an inorganic halide, a mixture of zinc chloride and an inorganic acid, a molten salt, phosphoric acid, a derivative of phosphoric acid, an organic halide, hydrazine, pine resin, an organic acid, an amino acid, an amine, and a hydrohalogenic acid salt of an amine. These may be used singly, or two or more kinds thereof may be used in combination.

Examples of the molten salt include ammonium chloride. Examples of the organic acid include lactic acid, citric acid, stearic acid, glutamic acid, glutaric acid, succinic acid, adipic acid, pimelic acid, suberic acid, benzoic acid, and malic acid. Examples of the pine resin include activated pine resin and non-activated pine resin. Pine resin is a rosin containing abietic acid as a main component. Examples of the amino acid include glycine, alanine, and glutamic acid. As the amine, general amines can be used, for example, a primary amine, a secondary amine, and a tertiary amine may be used. The hydrohalogenic acid salt of an amine may be a combination of an amine and a halogen element.

By using an organic acid having two or more carboxy groups or pine resin as the flux, an effect of further increasing the conduction reliability between the electrodes is achieved. Particularly, by using an organic acid having two or more carboxy groups as the flux, tin oxide on the solder particle surface is removed to expose tin in bulk to improve the wettability to the electrodes, thereby the occurrence of solder dewetting is prevented, and at the same time, an effect of forming solder bumps having a satisfactory shape is remarkably obtained. For example, when a rosin containing abietic acid as a main component, which is known as a base resin for a flux, is used, although a reoxidation preventive action or a function as viscosity adjustment is highly obtained, the effect of removing tin oxide on the solder particle surface and promoting wetting and spreading of solder on the electrode surface is low. On the other hand, when an organic acid having two or more carboxy groups is used, the effect of removing tin oxide on the solder particle surface to expose tin in bulk and improving the wettability to the electrodes is high compared to a rosin containing abietic acid as a main component. Furthermore, according to an organic acid having two or more carboxy groups, since the effect is obtained with a small amount (for example, 5 parts by mass or less with respect to 100 parts by mass of the solder particles) as compared with the above-described rosin, it is easy to apply the solder paste into a uniform thickness on the electrodes and between the electrodes. Therefore, the shape of the solder bumps can be made more uniform, and at the same time, the occurrence of bridging can be further suppressed.

The flux may be a low-molecular weight compound having a molecular weight of 200 or less, from the viewpoint that the flux is easily dissoluble in the dispersion medium and that the solder paste is easily applied. From the viewpoint that the above-described effect is obtained more remarkably, the molecular weight of the flux may be 180 or less or 150 or less. The molecular weight of the flux may be 100 or more, 150 or more, 180 or more, or 200 or more. In the present embodiment, the solder paste may contain a polymer compound such as a resin (for example, a compound having a weight average molecular weight of 300 or more) as the flux; however, from the viewpoint of removing tin oxide on the solder particle surface to expose tin in bulk and further improving the wettability to the electrodes, the content of this polymer compound may be 10 parts by mass or less, or may be 0 parts by mass, with respect to 100 parts by mass of the solder particles.

The melting point of the flux may be 50° C. or higher, 70° C. or higher, or 80° C. or higher and may be 200° C. or lower, 160° C. or lower, 150° C. or lower, or 140° C. or lower. When the melting point of the flux is in the above-described range, the flux effect is exhibited even more effectively, and the solder particles can be disposed even more efficiently on the electrodes. From the viewpoint that such an effect is obtained more remarkably, the melting point of the flux may be 80° C. to 190° C. or 80° C. to 140° C.

Examples of the flux having the melting point in the range of 80° C. to 190° C. include dicarboxylic acids such as succinic acid (melting point: 186° C.), glutaric acid (melting point: 96° C.), adipic acid (melting point: 152° C.), pimelic acid (melting point: 104° C.), and suberic acid (melting point: 142° C.); benzoic acid (melting point: 122° C.), and malic acid (melting point: 130° C.).

From the viewpoint of improving the cleaning performance in a step of removing, by cleaning, a residue of the solder particle-containing layer remaining between adjacent solder bumps after the step of forming solder bumps on the electrodes, the content of the flux may be 10 parts by mass or less, 8 parts by mass or less, 6 parts by mass or less, or 5 parts by mass or less, with respect to 100 parts by mass of the solder particles. From the viewpoint that the flux effect is exhibited even more effectively, the content of the flux may be 0.1 parts by mass or more, 0.2 parts by mass or more, or 0.3 parts by mass or more, with respect to 100 parts by mass of the solder particles. From these viewpoints, the content of the flux may be 0.1 to 10 parts by mass, 0.2 to 8 parts by mass, 0.3 to 6 parts by mass, or 0.3 to 5 parts by mass, with respect to 100 parts by mass of the solder particles.

(Dispersion Medium)

The dispersion medium may be any medium (for example, a liquid) that is volatile and is capable of dispersing solder particles, and there is not particular limitation. The dispersion medium may be, for example, an organic compound having a vapor pressure at 20° C. of 0.1 to 500 Pa. Incidentally, a compound having flux properties is not included in the dispersion medium, and a compound having thermosetting properties is also not included in the dispersion medium.

Examples of the dispersion medium include monohydric and polyhydric alcohols such as pentanol, hexanol, heptanol, octanol, decanol, ethylene glycol, diethylene glycol, propylene glycol, butylene glycol, terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amides such as N-methyl-2-pyrrolidone, N,N-dimethylacetamide, and N,N-dimethylformamide; aliphatic hydrocarbons such as cyclohexane, octane, nonane, decane, and undecane; aromatic hydrocarbons such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan. These may be used singly, or two or more kinds thereof may be used in combination.

The vapor pressure at 20° C. of the dispersion medium may be 0.1 to 500 Pa, 0.2 to 100 Pa, 0.3 to 50 Pa, or 0.5 to 10 Pa. When the vapor pressure at 20° C. is 0.1 Pa or higher, both coatability and volatility can be easily obtained. Particularly, when solder particles having a low melting point are used, since the temperature $T_1$ below the melting point of solder is lowered, the residual amount of the dispersion medium can be reduced by using a dispersion medium having a vapor pressure of 0.1 Pa or higher. On the other hand, when the vapor pressure at 20° C. is 500 Pa or lower, volatilization of the dispersion medium during coating is less likely to occur, and an increase in the concentration of the solder particles due to volatilization of the dispersion medium during continuous use is suppressed. Therefore, control of the coating thickness during continuous coating is likely to be facilitated.

Examples of the dispersion medium (organic compound) having a vapor pressure at 20° C. of 0.3 to 50 Pa include 1-heptanol (vapor pressure 28 Pa), 1-octanol (vapor pressure 8.7 Pa), 1-decanol (vapor pressure 1 Pa), ethylene glycol (vapor pressure 7 Pa), diethylene glycol (vapor pressure 2.7 Pa), propylene glycol (vapor pressure 10.6 Pa), 1,3-butylene glycol (vapor pressure 8 Pa), terpineol (vapor pressure 3.1 Pa), ethylene glycol monophenyl ether (vapor pressure 0.9 Pa), diethylene glycol methyl ether (ethyl carbitol) (vapor pressure 13 Pa), and diethylene glycol monobutyl ether (vapor pressure 3 Pa). When at least one kind of dispersion medium among these is used, volatilization of the dispersion medium during coating is easily suppressed, control of the coating thickness during continuous coating is facilitated, and the dispersion medium can be easily volatilized at the temperature $T_1$ below the melting point of solder.

The content of the dispersion medium is 30% by mass or more based on the total mass of the solder paste, and from the viewpoint of further suppressing the occurrence of bridging and solder dewetting, the content may be 35% by mass or more or 38% by mass or more. From the viewpoint that settling of the solder particles can be suppressed and the uniformity after application can be improved, the content of the dispersion medium may be 80% by mass or less, 70% by mass or less, or 60% by mass or less, based on the total mass of the solder paste. From these viewpoints, the content of the dispersion medium may be 30% to 80% by mass, 35% to 70% by mass, or 38% to 60% by mass, based on the total mass of the solder paste.

(Other Components)

The solder paste may further contain components other than the above-described components (other components). Examples of the other components include a compound having thermosetting properties (for example, a thermosetting resin). Examples of the compound having thermosetting properties include an oxetane compound, an epoxy compound, an episulfide compound, a (meth)acrylic compound, a phenol compound, an amino compound, an unsaturated polyester compound, a polyurethane compound, a silicone compound, and a polyimide compound. The content of the compound having thermosetting properties may be, for example, 0 to 10 parts by mass based on the total mass of the solder paste.

The solder paste may further contain additives such as a thixotropic agent, an oxidation inhibitor, an antifungal agent, and a delustering agent as the other components.

<Method for Forming Solder Bumps>

A method for forming solder bumps according to an embodiment includes: a step of applying the solder paste according to the above-described embodiment in an area of a member having a plurality of electrodes on the surface, the area having the electrodes disposed therein (application step); a step of volatilizing the dispersion medium in the solder paste by heating the member and the solder paste at a temperature $T_1$ below the melting point of solder (melting point of the solder constituting the solder particles), and forming a solder particle-containing layer on the member (drying step); a step of melting the solder particles in the solder particle-containing layer by heating the member and the solder particle-containing layer at a temperature $T_2$ equal to or higher than the melting point of solder, and forming solder bumps on the electrodes of the member (reflow step); and a step of removing, by cleaning, a residue of the solder particle-containing layer remaining between adjacent solder bumps (cleaning step). According to this method, a member with solder bumps having solder bumps on the electrodes is obtained.

In conventional methods for forming solder bumps, when a solder paste containing a large amount, such as 30% by mass or more, of a dispersion medium is used, solder dewetting is likely to occur, and the shape of the solder bumps is likely to become non-uniform. On the other hand, in the above-described method, since the dispersion medium is removed by heating at the temperature $T_1$ below the melting point of solder before heating at the temperature $T_2$ equal to or higher than the melting point of solder, solder dewetting is less likely to occur, and the shape of the solder bumps is less likely to become non-uniform. The reasons for this are speculated to be that a reaction on the electrode surface by the effect of the flux easily occurs by preliminarily removing the dispersion medium in the solder paste, and that the solder particles on the electrodes approach close to each other, and the flux concentration in between the solder particles on the electrodes increases, so that melting between the solder particles is promoted.

Furthermore, in the above-described method, since oxidation on the solder particle surface is promoted by heating at the temperature $T_1$ below the melting point of solder, the effect of suppressing the occurrence of bridging is enhanced. As described above, it is speculated that in between the electrodes, the growth of the solder particles induced by melt fusion between the solder particles is inhibited by oxidation on the surface of the solder particles; however, by heating at the temperature $T_1$ below the melting point of solder, the oxide film on the solder particle surface becomes thick or uniformly formed, so that the growth of the solder particles is more easily inhibited, and as a result, the effect of suppressing the occurrence of bridging is enhanced.

The method for forming solder bumps according to the above-described embodiment will be described below with reference to the drawings. Incidentally, in the drawings, identical or equivalent portions will be assigned with an identical reference numeral, and any redundant descriptions will not be repeated.

Figure 2:
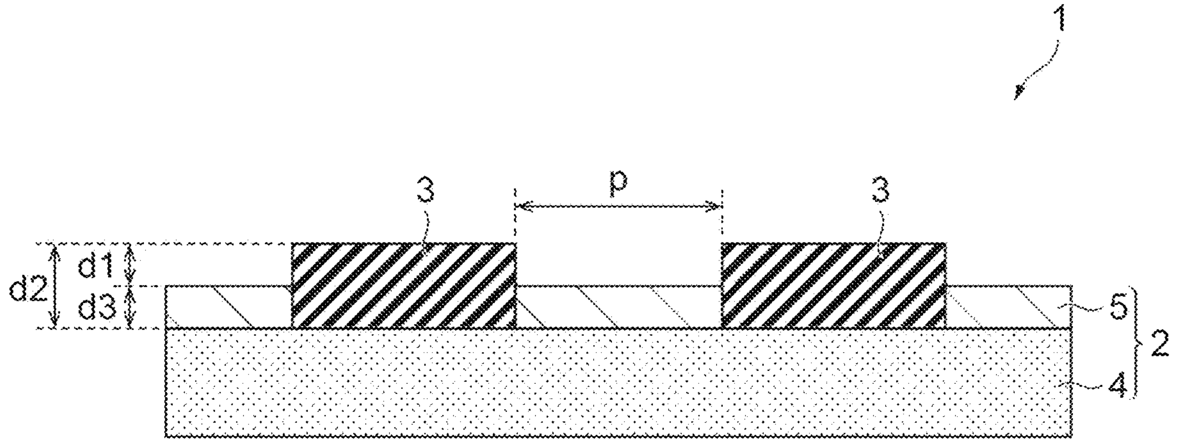
FIG. 2 is a schematic cross-sectional view taken along line II-II in FIG. 1.
Figure 3:
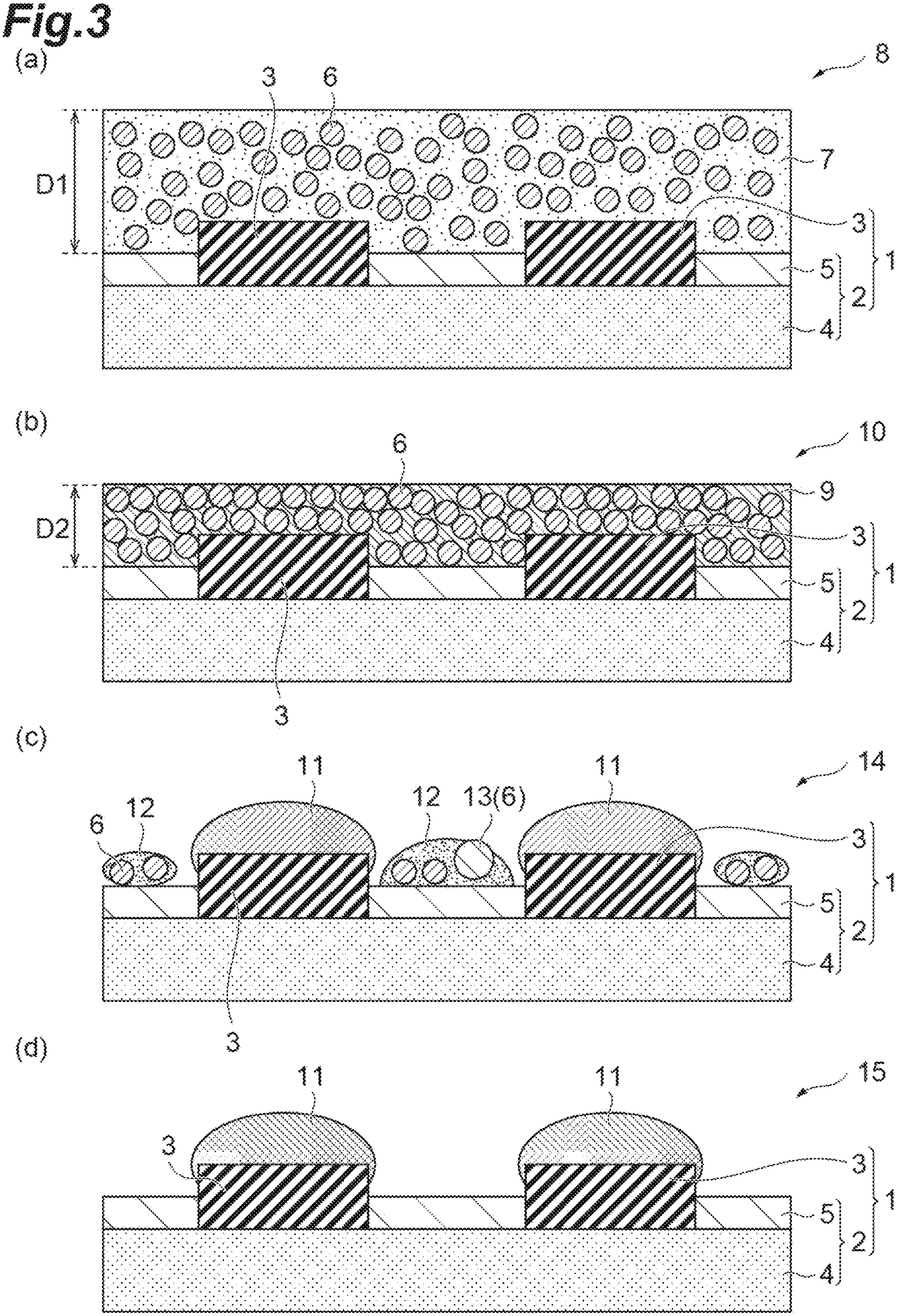
FIG. 3 is schematic cross-sectional views for explaining the method for forming solder bumps according to an embodiment.

FIG. 1 is a plan view illustrating an example of a member (member having a plurality of electrodes on the surface) to which the method for forming solder bumps according to the above-described described embodiment is applied, and FIG. 2 is a schematic cross-sectional view taken along line II-II of FIG. 1. FIG. 3 is schematic cross-sectional views explaining the method for forming solder bumps according to the above-described embodiment. Specifically, FIG. 3(*a*) is a schematic cross-sectional view for explaining a coating step, FIG. 3(*b*) is a schematic cross-sectional view for explaining a drying step, FIG. 3(*c*) is a schematic cross-sectional view for explaining a reflow step, and FIG. 3(*d*) is a schematic cross-sectional view for explaining a cleaning step.

(Member)

A member 1 shown in FIG. 1 is, for example, an electronic member such as a circuit member and includes an insulating base material 2 and electrodes 3 provided on the surface of the insulating base material 2. The insulating base material 2 includes, for example, a base material 4 and an insulating resin film 5 that covers an area on the surface of the base material 4 where the electrodes 3 are not provided.

Specific examples of the member 1 include a semiconductor substrate having electrodes formed on the surface (for example, a semiconductor wafer such as a silicon wafer), a glass substrate having electrodes formed on the surface, a ceramic substrate having electrodes formed on the surface, a printed wiring board, and a semiconductor package substrate. Among these, since a semiconductor substrate (for example, a silicon substrate) has satisfactory close adhesion to electrodes, in the case of using a semiconductor substrate having electrodes formed on the surface, satisfactory close adhesiveness between the base material and the electrodes tends to be maintained even after the formation of solder bumps. Furthermore, since the base material of the semiconductor substrate is smooth, the height of the electrode can be easily controlled when forming electrodes on the surface of the semiconductor substrate, and the height of the electrodes can be further lowered. Therefore, the height of the electrodes formed on the surface of a semiconductor substrate tend to be low, and the occurrence of solder bridging between the electrodes is easily suppressed.

Examples of the electrode 3 include electrodes including titanium, nickel, chromium, copper, aluminum, palladium, platinum, and gold. From the viewpoint of close adhesiveness to the base material 4, the electrode 3 may be an electrode formed by laminating a titanium layer, a nickel layer, and a copper layer in this order. When the base material 4 is a silicon wafer, the adhesiveness is improved by oxidizing the surface of the silicon wafer to generate silicon oxide and for ding a titanium layer on the silicon oxide. Furthermore, when a nickel layer is provided on the titanium layer and a copper layer is provided thereon, diffusion of copper inside the silicon wafer can be suppressed as compared to the case of providing a copper layer directly on a titanium layer. From the viewpoint that it is easier for tin to wet and spread, the surface of the electrodes may include at least one selected from the group consisting of gold, palladium, and copper. Particularly, the wettability of solder to the electrodes is improved by forming a palladium layer and/or a gold layer on the surface of the electrodes.

Regarding the shape in a plan view of the electrodes 3, various shapes such as a square shape, a rectangular shape, and a circular shape can be adopted according to the size and the like of the member 1. The shape in a plan view of the electrodes 3 may be a square shape, from the viewpoint that the insulating base material 2 can be miniaturized.

The electrodes 3 are arranged, for example, as shown in FIG. 1, in a dotted fashion in the peripheral edge portion (peripheral portion) of the insulating base material 2 as viewed in a plan view, and the space between adjacent electrodes 3 and 3 is very narrow. Specifically, a distance p between adjacent electrodes 3 and 3 is, for example, less than 25 μm. From the viewpoint that bridging is even further less likely to occur, the distance p between adjacent electrodes 3 and 3 may be 3 μm or more, 5 mm or more, or 10 μm or more. The distance p between adjacent electrodes 3 and 3 is the length of a portion indicated by p as shown in FIG. 2 and is the value at a place where the distance between adjacent electrodes is the smallest.

The height d1 of an electrode 3 exposed on the insulating base material 2 may be 30 μm or less, 20 μm or less, or 10 μm or less, from the viewpoint that it is even more difficult for bridging to occur. Here, the height d1 of the electrode 3 is the length of a portion indicated by d1 in FIG. 2 and can be determined by the following Formula (I).

Height of electrode 3=[Shortest distance d2 from surface of electrode 3 to base material 4]−[shortest distance d3 from surface of insulating base material 2 (surface of resin film 5) to base material 4] (I)

The height d1 of the electrode 3 can have a negative value. That is, the shortest distance d2 from the surface of the electrode 3 to the base material 4 may be smaller than the shortest distance d3 from the surface of the insulating base material 2 (surface of the resin film 5) to the base material 4. The height d1 of the electrode 3 may be, for example, 1 μm or more.

The resin film 5 may be a film formed from a cured product of a curable resin composition including a thermosetting compound such as an oxetane compound, an epoxy compound, an episulfide compound, a (meth)acrylic compound, a phenol compound, an amino compound, an unsaturated polyester compound, a polyurethane compound, a silicone compound, or a polyimide compound. When an epoxy compound or a polyimide compound is used as the thermosetting compound, the curability and viscosity of the curable resin composition are even further improved, and the characteristics and insulation reliability of the resin film 5 when left to stand at a high temperature are excellent.

(Application Step)

In the application step, as shown in FIG. 3(*a*), the solder paste according to the above-described embodiment containing solder particles 6 is applied in an area of the member 1 where electrodes 3 are disposed, and a solder paste layer 7 is formed on the member 1. As a result, a member 8 with a solder paste is obtained.

The solder paste is applied such that the solder paste layer 7 is formed at least on the electrodes 3 and between the electrodes 3 and 3. The solder paste may be applied on the member 1 so as to cover all the electrodes of the member 1 or may be applied, for example, over the entire surface of the member 1 (entirety of the surface where the electrodes 3 are formed). Examples of a method for applying the solder paste include methods of applying by using screen printing, transfer printing, offset printing, a jet printing method, a dispenser, a jet dispenser, a needle dispenser, a comma coater, a slit coater, a die coater, a gravure coater, slit coating, letterpress printing, intaglio printing, gravure printing, stencil printing, soft lithography, bar coating, an applicator, a particle deposition method, a spray coater, a spin coater, and a dip coater.

The thickness D1 of the solder paste layer 7 can be appropriately changed according to the thickness of the solder particle-containing layer 9 obtainable after drying, and the thickness D1 may be, for example, 1 μm or more, 2 μm or more, 3 μm or more, 5 μm or more, 10 μm or more, 15 μm or more, or 20 μm or more and may be 120 μm or less, 100 μm or less, 80 μm or less, or 50 μm or less. Incidentally, the thickness D1 of the solder paste layer 7 is the length of a portion indicated by D1 in FIG. 3(*a*) and is the shortest distance from the surface of the insulating base material 2 (surface of the resin film 5) to the surface of the solder paste layer 7.

(Drying Step)

In the drying step, as shown in FIG. 3(*b*), the dispersion medium in the solder paste (solder paste layer 7) is volatilized by heating the member 8 with solder paste at a temperature $T_1$ below the melting point of solder (melting point of the solder constituting the solder particles 6), and a solder particle-containing layer 9 is formed on the member 1. As a result, a member 10 with a solder particle-containing layer is obtained.

The drying temperature $T_1$ is a temperature below the melting point of solder and is, for example, 30° C. to 120° C. From the viewpoint of oxidizing the surface of the solder particles, the drying temperature $T_1$ may be a temperature close to the melting point of solder and may be, for example, 50° C. or higher, 70° C. or higher, or 90° C. or higher.

The drying time may be appropriately adjusted according to the type and amount of the dispersion medium used. Specifically, the drying time may be, for example, 1 minute or more and may be 120 minutes or less.

The atmosphere during drying may be an air atmosphere or may be a nitrogen atmosphere. When an air atmosphere is adopted as the atmosphere during drying, the surface of the solder particles is easily oxidized. As a result, at the time of forming solder bumps (during the reflow step that will be described below), growth of the solder particles induced by melt fusion between the solder particles dispersed between the electrodes 3 and 3 is inhibited, and the occurrence of bridging between the electrodes tends to be further suppressed. This effect is even more easily obtained when the drying temperature $T_1$ is a temperature close to the melting point of solder.

The solder particle-containing layer 9 formed in the drying step includes solder particles 6 and a flux. In the solder particle-containing layer 9, a portion of the dispersion medium may remain without being volatilized; however, the content of the dispersion medium in the solder particle-containing layer 9 may be 5% by mass or less, 1% by mass or less, or 0.1% by mass or less, based on the total mass of the solder particle-containing layer.

From the viewpoint of even further suppressing the occurrence of bridging, the thickness D2 of the solder particle-containing layer 9 may be equal to or less than two-thirds of the distance p between adjacent electrodes 3 and 3 or may be equal to or less than one-third of the distance p. The thickness D2 of the solder particle-containing layer 9 may be specifically, for example, 50 μm or less, 40 μm or less, 30 μm or less, or 25 μm or less. From the viewpoint of even further suppressing the occurrence of solder dewetting, the thickness D2 of the solder particle-containing layer 9 may be, for example, 3 μm or more, 5 μm or more, 10 μm or more, or 15 μm or more. Incidentally, the thickness D2 of the solder particle-containing layer 9 is the length of a portion indicated by D2 in FIG. 3(*b*) and is the shortest distance from the surface of the insulating base material 2 (surface of the resin film 5) to the surface of the solder particle-containing layer 9.

(Reflow Step)

In the reflow step, as shown in FIG. 3(*c*), the member 10 with the solder particle-containing layer (member 1 and solder particle-containing layer 9) is heated at a temperature $T_2$ equal to or higher than the melting point of solder to melt the solder particles 6 in the solder particle-containing layer 9, and solder bumps 11 are formed on the electrodes 3 of the member 1. In this stage, a residue of the solder particle-containing layer 9 is present between the solder bumps 11 and 11 (between the electrodes 3 and 3). The residue of the solder particle-containing layer 9 includes, for example, solder particles 6 and organic components 12 such as a flux. The solder particles 6 include, for example, coarse particles 13 grown by melt fusion between the solder particles.

The heat treatment (heating at a temperature $T_2$ equal to or higher than the melting point of solder) can be carried out by using, for example, a hot plate, a hot air dryer, a hot air heating furnace, a nitrogen dryer, an infrared dryer, an infrared heating furnace, a far-infrared heating furnace, a microwave heating apparatus, a laser heating apparatus, an electronic heating apparatus, a heater heating apparatus, a steam heating furnace, or a hot plate pressing apparatus.

The heat treatment temperature $T_2$ is a temperature equal to or higher than the melting point of solder and may be, for example, a temperature higher by 5° C. or more, 10° C. or more, 20° C. or more, 30° C. or more, or 40° C. or more, than the melting point of solder. When the heat treatment temperature $T_2$ is higher by 10° C. or more than the melting point of solder, the occurrence of solder dewetting tends to be even further suppressed. The difference between the heat treatment temperature $T_2$ and the melting point of solder may be 40° C. or lower, 30° C. or lower, or 20° C. or lower. When the difference between the heat treatment temperature $T_2$ and the melting point of solder is large such as 40° C. or lower, the occurrence of bridging tends to be even further suppressed. From the viewpoint of even further suppressing the occurrence of solder dewetting and bridging, the heat treatment temperature $T_2$ may be a temperature higher by 10° C. to 40° C. than the melting point of solder. The heat treatment time may be, for example, 1 minute or more and may be 120 minutes or less.

The height of the solder bumps can be adjusted by the composition, the coating amount, and the like of the solder paste and can be set to, for example, 3 to 30 μm.

(Cleaning Step)

In the cleaning step, as shown in FIG. 3(*d*), a residue of the solder particle-containing layer 9 remaining between adjacent solder bumps 11 and 11 is removed by cleaning the uncleaned member 14 with solder bumps obtained in the reflow step. As a result, a member 15 with solder bumps is obtained.

Cleaning may be, for example, cleaning by water or may be solvent cleaning. Examples of the cleaning liquid used for cleaning include water, an alcohol-based solvent, a terpene-based solvent, a petroleum-based solvent, a hydrocarbon-based solvent, and an alkali-based solvent. These may be used singly, or two or more kinds thereof may be used as mixtures. Furthermore, the cleaning liquid may contain a detergent (surfactant or the like).

<Method for Producing Connection Structure>

Next, a method for producing a connection structure (for example, semiconductor device) using a member 15 with solder bumps obtainable by the method for forming solder bumps according to the above-described embodiment will be described.

Figure 4:
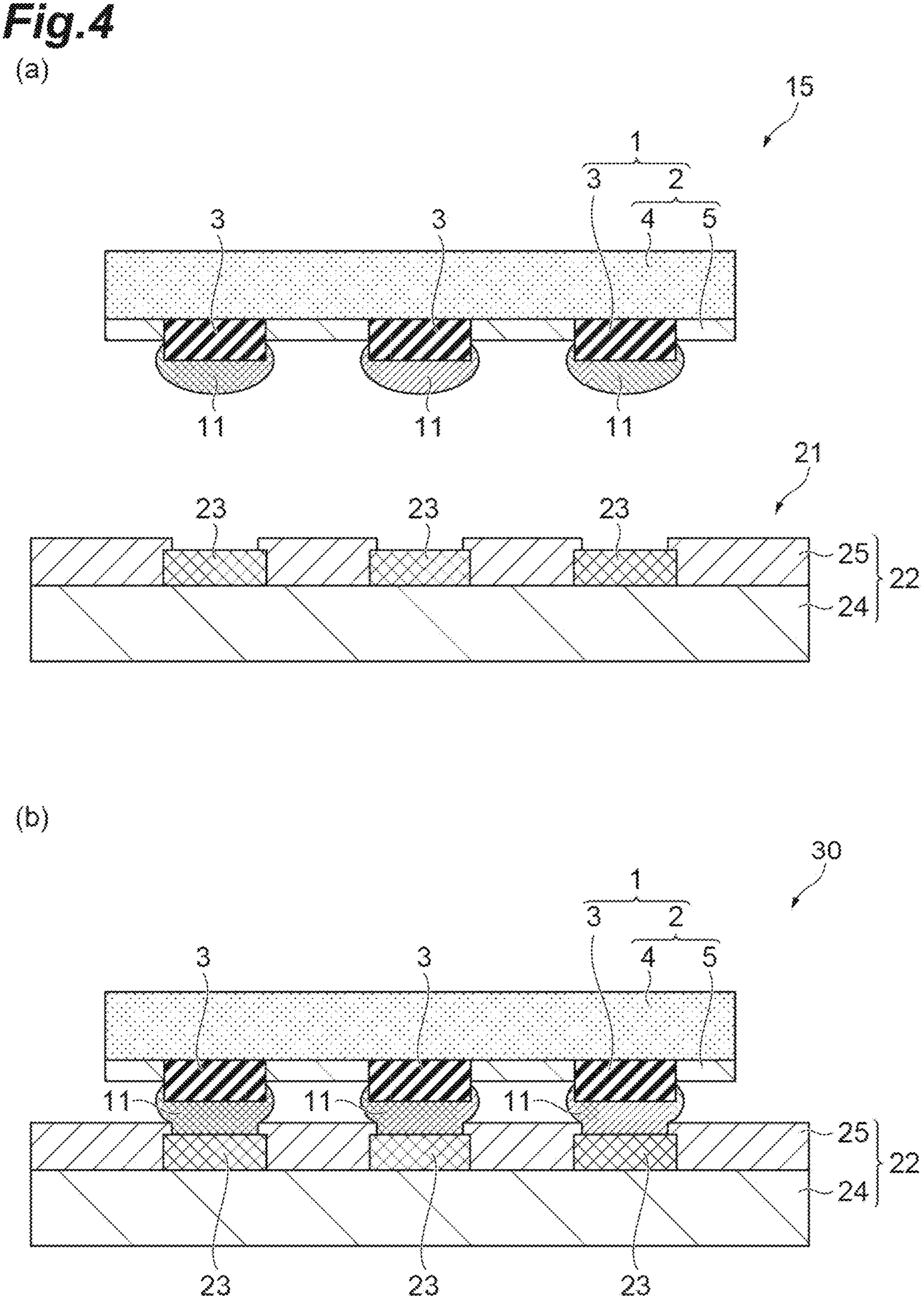
FIG. 4 is schematic cross-sectional views for explaining a method for producing a connection structure according to an embodiment.

FIG. 4 is a schematic cross-sectional view for explaining a method for producing a connection structure using a member 15 with solder bumps. In the method for producing a connection structure, first, as shown in FIG. 4(*a*), the member 15 with solder bumps as a first member and a second member 21 are prepared and disposed such that the electrodes of each other (first electrodes 3 and second electrodes 23) face each other. Next, as shown in FIG. 4(*b*), the member 15 with solder bumps and the second member 21 are heated in a state of being pressed in the facing direction to electrically connect the electrodes of each other (first electrodes 3 and second electrodes 23), with the solder bumps 11 being interposed therebetween. As a result, a connection structure 30 is obtained.

The second member 21 is, for example, an interposer substrate and includes an insulating base material 22 and electrodes (second electrodes) 23 provided on the surface of the insulating base material 22. The insulating base material 22 includes, for example, a base material 24 and an insulating resin film 25 covers an area in the surface of the base material 24 where the electrodes 23 are not provided. As the second member 21, those mentioned as examples of the member 1 used for the production of the member 15 with solder bumps can be used. The second member 21 may be identical with or different from the member 1 used for the production of the member 15 with solder bumps. Furthermore, on the electrodes 23 of the second member 21, solder bumps may be formed.

EXAMPLES

Hereinafter, the present invention will be described more specifically by way of Examples and Comparative Examples; however, the present invention is not intended to be limited to the following Examples.

<Preparation of Materials>

[Solder Particles]

As solder particles having a Bi content of 58% by mass and an Sn content of 42% by mass (Bi58-Sn42 solder particles, melting point: 138° C.), solder particles A1 to A5 shown below were prepared.

Solder particles A1 (average particle size: 1.8 μm or less, (d90=1.8 μm), manufactured by 5N Plus, Inc., Type 10)

Solder particles A2 (average particle size: 2.9 μm or less (d90=2.9 μm), manufactured by 5N Plus, Inc., Type 9)

Solder particles A3 (average particle size: 5.0 μm or less (d90=5.0 μm), manufactured by 5N Plus, Inc., Type 8)

Solder particles A4 (average particle size: 8.0 μm or less (d90=8.0 μm), manufactured by 5N Plus, Inc., Type 7)

Solder particles A5 (average particle size: 12.0 μm or less (d90=12.0 μm), manufactured by 5N Plus, Inc., Type 6)

As solder particles having an Sn content of 96.5% by mass, an Ag content of 3.0% by mass, and a Cu content of 0.5% by mass (Sn96.5-Ag3.0-Cu0.5 solder particles, melting point: 218° C.), solder particles B1 and B2 shown below were prepared.

Solder particles B1 (average particle size: 1.8 μm or less (d90=1.8 μm), manufactured by 5N Plus, Inc., Type 10)

Solder particles B2 (average particle size: 8.0 μm or less (d90=8.0 μm), manufactured by 5N Plus, Inc., Type 7)

The average particle sizes of the above-described solder particles A1 to A5 and solder particles B1 and B2 were measured by the following method. First, a powder of solder particles was placed on a carbon tape for SEM with a spatula, and this was used as a sample for SEM. Next, this sample for SEM was observed at a magnification of 5000 times by using a SEM apparatus, and a SEM image was obtained. From the obtained SEM image, a rectangle circumscribing a solder particle was drawn by means of image processing software, and the long side of the rectangle was taken as the maximum diameter of the particle. This measurement was performed for 100 solder particles by using a plurality of SEM images, the average value of the maximum diameters of 50 solder particles was calculated, and this was defined as the average particle size.

[Others]

Adipic acid (manufactured by FUJIFILM Wako Pure Chemical Corporation, melting point: 152° C.) was prepared as a flux, and diethylene glycol (manufactured by FUJIFILM Wako Pure Chemical Corporation, boiling point: 244° C., vapor pressure 2.7 Pa (20° C.)) was prepared as a volatile dispersion medium.

Examples 1 to 48 and Comparative Examples 1 to 10

(Production of Solder Paste)

The solder particles shown in Table 1 to Table 4, diethylene glycol, and optionally adipic acid were mixed in the blending amounts (unit: parts by mass) shown in Table 1 to Table 4, and solder pastes of Examples 1 to 48 and Comparative Examples 1 to 10 were obtained.

(Preparation of Semiconductor Chip)

Figure 5:
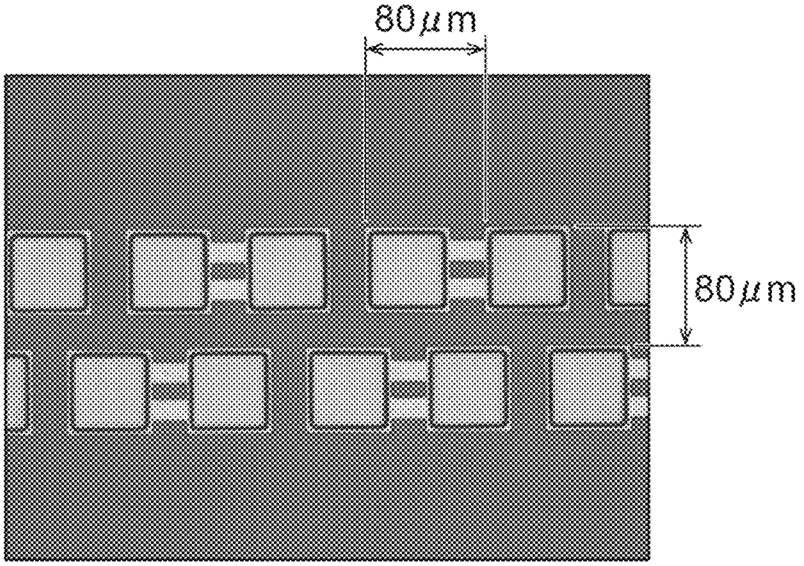
FIG. 5 is photographs of the appearance of semiconductor chips used in Examples and Comparative Examples.
Figure 5:
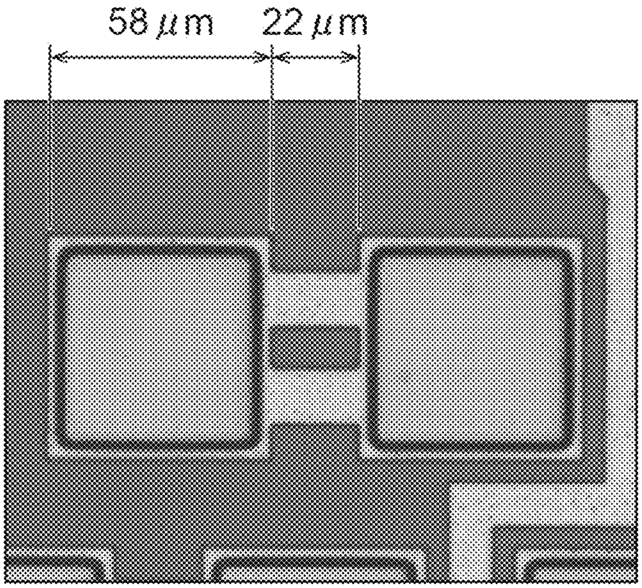

A semiconductor chip (manufactured by WALTS CO., LTD., WALTS-TEG IP80-0101JY, trade name) having a nickel layer and a gold layer laminated in this order on a silicon substrate and having a plurality of electrodes formed thereon, was prepared. The plurality of electrodes were arranged in two rows of 39 terminals×40 terminals (79 terminals in total), with one electrode counted as one terminal, in the peripheral edge part of a silicon substrate having a square shape as viewed in a plan view. More specifically, electrode groups of 39 terminals×40 terminals were formed along the four sides of a silicon substrate having a square shape as viewed in a plan view, with two places per side (eight places in total). As shown in FIG. 5(*a*) and FIG. 5(*b*), the pitch between electrodes was 80 μm, the electrode size was 58 μm×58 and the space between electrodes (distance between adjacent electrodes) was 22 μm. Furthermore, the height d1 of an electrode exposed on the silicon substrate (distance from the surface of the silicon substrate to the surface of an electrode) was 3 μm.

(Formation of Solder Bumps)

[Application Step]

A solder paste produced as described above was applied on a face of a semiconductor chip prepared as described above, where the electrodes were formed, by using a desktop roll coater.

[Drying Step]

Next, the semiconductor chip having the solder paste applied thereon was placed on a hot plate set at the temperature (drying temperature) shown in Table 1 to Table 4, and diethylene glycol was volatilized. As a result, a solder particle-containing layer was formed, and a semiconductor chip with a solder particle-containing layer was obtained. The drying time (placement time) was set to 60 minutes in the case of 30° C., 30 minutes in the case of 50° C., and 1 minute in the case of 90° C.

[Measurement of Thickness of Solder Particle-Containing Layer]

The thickness D2 of the solder particle-containing layer formed by the drying step was measured by using a laser displacement meter (manufactured by KEYENCE CORPORATION, LK-G5000, trade name). Specifically, measurements were made at a total of five places between the electrodes, and the average value thereof was designated as the thickness D2 of the solder particle-containing layer.

[Reflow Step]

The semiconductor chip (semiconductor chip with a solder particle-containing layer) after the drying step was placed on a hot plate heated in advance to 180° C. or 240° C. and heat-treated in a state of being purged with nitrogen. The heat treatment temperature was set to 180° C. in Examples 1 to 32 and Comparative Examples 1 to 10, in which solder particles A1 to A5 were used, and was set to 240° C. in Examples 33 to 48, in which solder particles B1 and B2 were used. The heat treatment time (placement time) was set to 10 seconds. As a result, the solder particles were melted, and solder bumps were formed on the electrodes.

Figure 6:
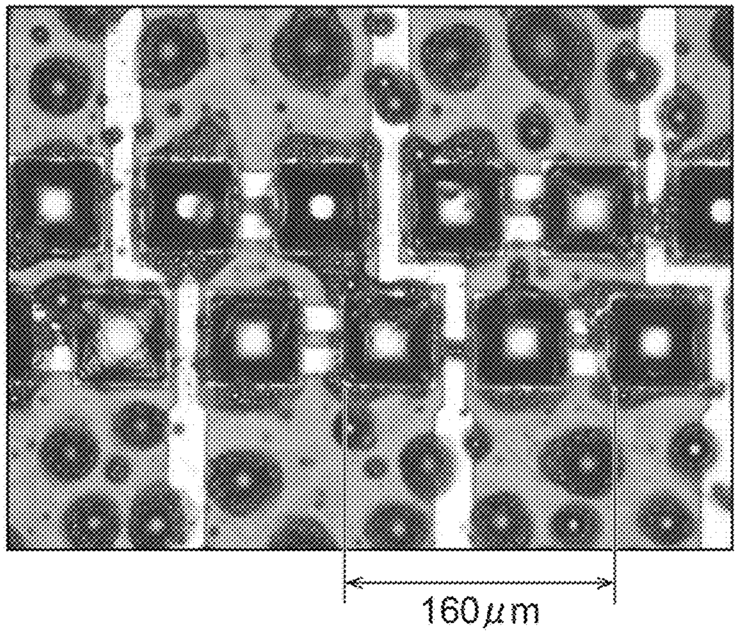
FIG. 6 is photographs of the appearance of semiconductor chips of Example 1 after a reflow step.
Figure 6:
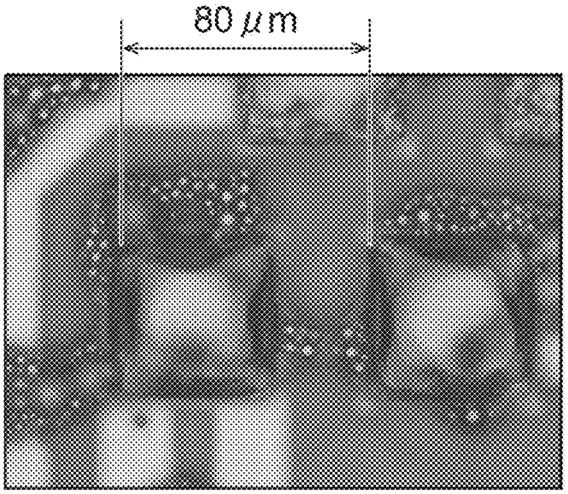
Figure 6:
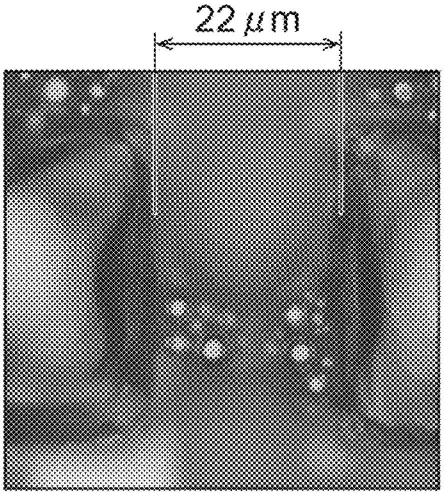

For reference, photographs of the appearance of the semiconductor chip (uncleaned semiconductor chip with solder bumps) of Example 1 after the reflow step are shown in FIG. 6. FIG. 6(*a*) is a microphotograph obtained by observing the semiconductor chip by using a microscope (digital microscope VHX-5000, manufactured by KEYENCE CORPORATION), and FIG. 6(*b*) and FIG. 6(*c*) are photographs showing enlarged views of the space between electrodes in FIG. 6(*a*). As shown in FIG. 6(*a*), it was verified that solder bumps were uniformly formed on the electrodes in the Examples. Furthermore, as shown in FIG. 6(*b*) and FIG. 6(*c*), it was verified that in the Examples, solder particles were present independently as microparticles in between the electrodes, and bridging did not occur. Incidentally, the above-described photographs of the appearance were obtained by making observation using a microscope (digital microscope, VHX-5000, manufactured by KEYENCE CORPORATION).

[Cleaning Step]

The semiconductor chip after the reflow step (uncleaned semiconductor chip with solder bumps) was immersed in an acetone solution (manufactured by FUJIFILM Wako Pure Chemical Corporation, special grade) and was subjected to ultrasonic cleaning for 10 minutes. As a result, a residue of the solder particle-containing layer remaining between the solder bumps was removed, and a semiconductor chip with solder bumps was obtained.

Figure 7:
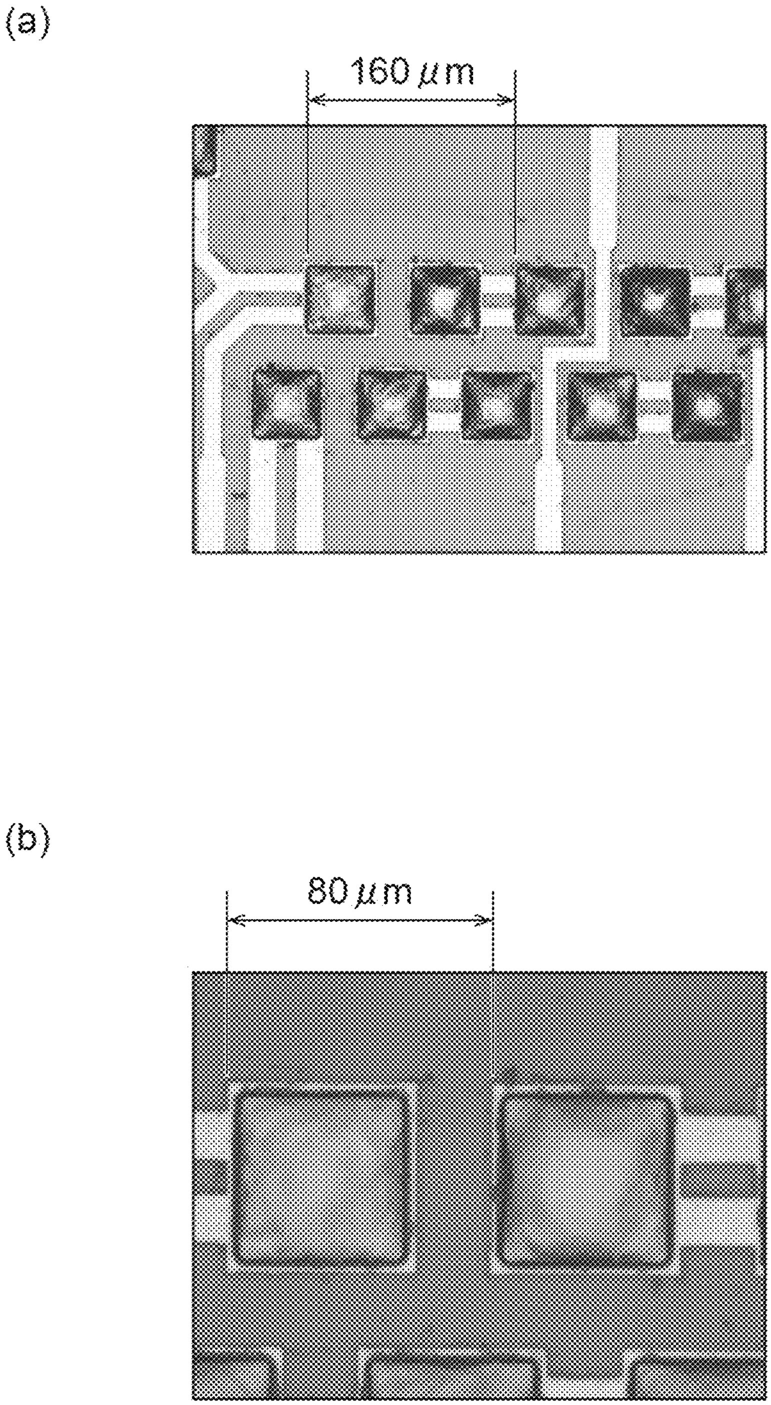
FIG. 7 is photographs of the appearance of semiconductor chips of Example 1 after a cleaning step.

Photographs of the appearance of the semiconductor chip (semiconductor chip with solder bumps) of Example 1 after the cleaning step are shown in FIG. 7. FIG. 7(*a*) is a microphotograph obtained by making observation using a microscope (digital microscope VHX-5000, manufactured by KEYENCE CORPORATION), and FIG. 7(*b*) is a photograph showing an enlarged view of the space between the electrodes in FIG. 7(*a*). As shown in FIG. 7(*a*) and FIG. 7(*b*), in the Examples, it was verified that bumps were formed on the electrodes, and a residue of the solder particles and the like between the electrodes was removed.

[Observation of Cross-Section]

A cross-section of an electrode portion of the semiconductor chip (semiconductor chip with solder bumps) after the cleaning step was observed by using a microscope (digital microscope VHX-5000, manufactured by KEYENCE CORPORATION), and the height of the solder bumps was measured. In all of the Examples, the height of the solder bumps was about 10 μm.

Figure 8:
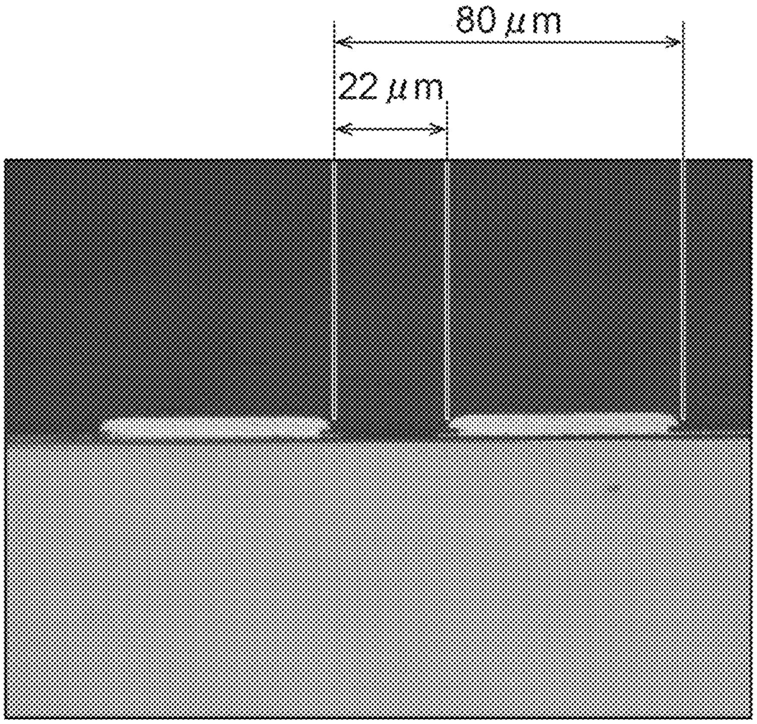
FIG. 8 is photographs of cross-sections of the semiconductor chips used in Examples and Comparative Examples, and photographs of cross-sections of the semiconductor chip of Example 1 after a cleaning step.
Figure 8:
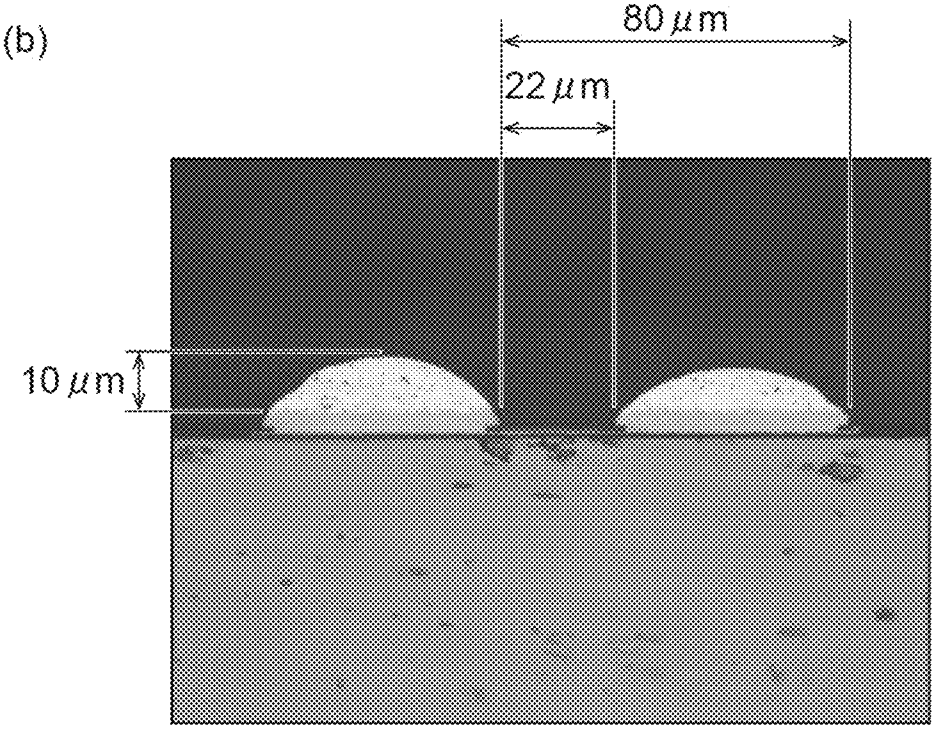

For reference, a microphotograph obtained by observing a cross-section of the electrode portion of the semiconductor chip before application of the solder paste in the same manner as described above is shown in FIG. 8(*a*), and a photograph of a cross-section of the semiconductor chip (semiconductor chip with solder bumps) of Example 1 obtained by the above-described observation of the cross-section is shown in FIG. 8(*b*).

(Evaluation)

[Evaluation of Bridging Suppression Properties (Insulating Properties)]

Figure 9:
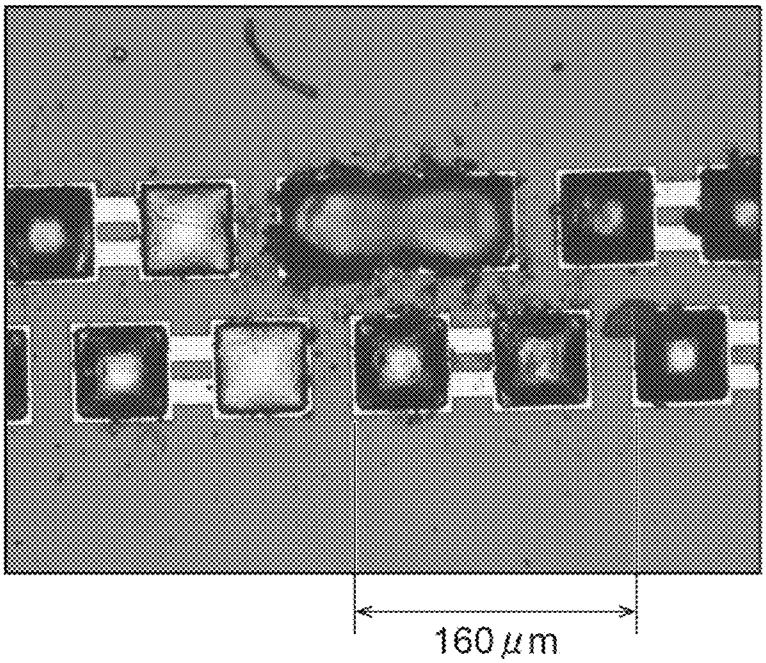
FIG. 9 is a photograph showing an example of a place of occurrence of bridging observed in the evaluation of bridging suppression properties.

Eight electrode groups (39 terminals×40 terminals) on the semiconductor chip were observed by using a microscope (digital microscope VHX-5000, manufactured by KEY- ENCE CORPORATION), and the number of places where bridging occurred was checked. For reference, a photograph (illustration) of the place of occurrence of bridging is shown in FIG. 9.

The bridging suppression properties were evaluated according to the following criteria. When the rating was C or higher, it was determined that the occurrence of bridging was suppressed. The results are shown in Table 1 to Table 4.

A: Places of occurrence of bridging: 0 places

B: Places of occurrence of bridging: 1 or more places and 5 or fewer places

C: Places of occurrence of bridging: 6 or more places and 9 or fewer places

D: Places of occurrence of bridging: 10 or more places and 19 or fewer places

E: Places of occurrence of bridging: 20 or more places and 49 or fewer places

F: Places of occurrence of bridging: 50 or more places

[Evaluation of Solder Dewetting Suppression Properties (Bump Formability)]

Figure 10:
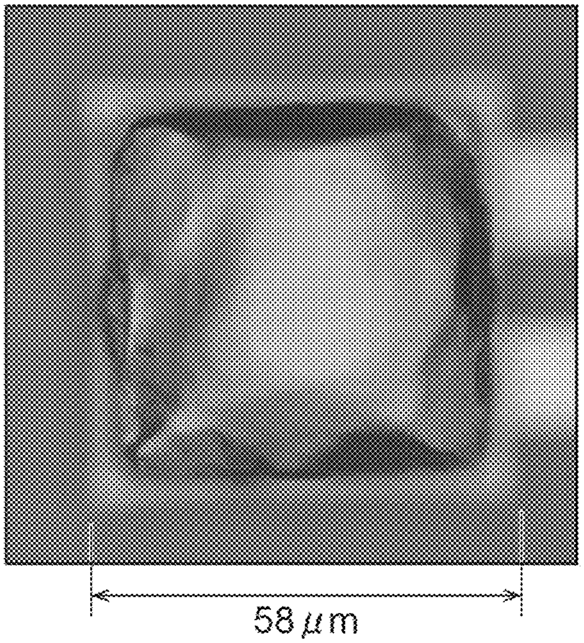
FIG. 10 is photographs showing an example of solder bumps observed in the evaluation of solder dewetting suppression properties.
Figure 10:
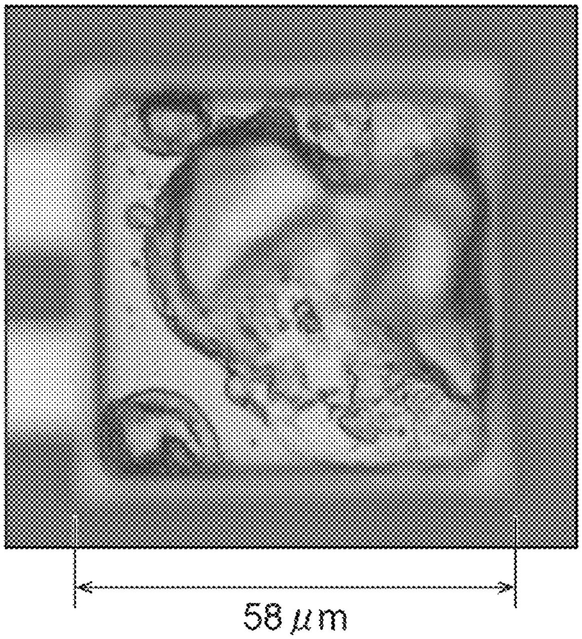

Eight electrode groups (39 terminals×40 terminals) on the semiconductor chip were observed by using a microscope (digital microscope VHX-5000, manufactured by KEYENCE CORPORATION), and the number of electrodes in which solder dewetting occurred was checked. As shown in FIG. 10(*a*), an electrode having the entire surface (100% by area) covered with solder was determined as a good-quality product, and as shown in FIG. 10(*b*), an electrode in which a spot that was not covered with solder was present in a portion of the surface (electrode in which the gold electrode was at least partially exposed) was determined as an electrode where solder dewetting occurred.

The solder dewetting suppression properties were evaluated according to the following criteria. When the rating was C or higher, it was determined that the occurrence of solder dewetting was suppressed. The results are shown in Table 1 to Table 4.

A: Number of electrodes with the occurrence of solder dewetting: 0 pieces

B: Number of electrodes with the occurrence of solder dewetting: 1 or more pieces and 5 or fewer pieces C: Number of electrodes with the occurrence of solder dewetting: 6 or more pieces and 9 or fewer pieces D: Number of electrodes with the occurrence of solder dewetting: 10 or more pieces and 19 or fewer pieces E: Number of electrodes with the occurrence of solder dewetting: 20 or more pieces and 49 or fewer pieces F: Number of electrodes with the occurrence of solder dewetting: 50 or more pieces

TABLE 1

| | | Example | | | | | | | | | | | | | | | |
|---|---|---|---|---|---|---|---|---|---|---|---|---|---|---|---|---|---|
| | Item | 1 | 2 | 3 | 4 | 5 | 6 | 7 | 8 | 9 | 10 | 11 | 12 | 13 | 14 | 15 | 16 |
| Composition | Solder particles A1 | — | — | — | — | — | — | — | — | 60 | 60 | 60 | 60 | 60 | 60 | 60 | 60 |
| (parts | Solder particles A2 | 60 | 60 | 60 | 60 | 60 | 60 | 60 | 60 | — | — | — | — | — | — | — | — |
| by mass) | Diethylene glycol | 40 | 40 | 40 | 40 | 40 | 40 | 40 | 40 | 40 | 40 | 40 | 40 | 40 | 40 | 40 | 40 |
| | Flux | 1 | 1 | 1 | 1 | 1 | 1 | 1 | 1 | 1 | 1 | 1 | 1 | 1 | 1 | 1 | 1 |
| Step | Drying temperature (° C.) | 90 | 30 | 90 | 50 | 30 | 90 | 50 | 30 | 90 | 30 | 90 | 50 | 30 | 90 | 50 | 30 |
| | Thickness of solder particle-containing layer (μm) | 13 | 13 | 18 | 18 | 18 | 23 | 23 | 23 | 13 | 13 | 18 | 18 | 18 | 23 | 23 | 23 |
| Evaluation | Bridging | A | A | A | A | B | A | B | B | A | A | A | A | A | A | A | A |
| | Solder dewetting | A | A | A | A | A | A | A | A | A | A | A | A | A | A | A | A |

TABLE 2

| | | Example | | | | | | | | | | | | | | | |
|---|---|---|---|---|---|---|---|---|---|---|---|---|---|---|---|---|---|
| | Item | 17 | 18 | 19 | 20 | 21 | 22 | 23 | 24 | 25 | 26 | 27 | 28 | 29 | 30 | 31 | 32 |
| Composition | Solder particles A3 | 60 | 60 | 60 | 60 | 60 | 60 | 60 | 60 | — | — | — | — | — | — | — | — |
| (parts | Solder particles A4 | — | — | — | — | — | — | — | — | 60 | 60 | 60 | 60 | 60 | 60 | 60 | 50 |
| by mass) | Diethylene glycol | 40 | 40 | 40 | 40 | 40 | 40 | 40 | 40 | 40 | 40 | 40 | 40 | 40 | 40 | 40 | 40 |
| | Flux | 1 | 1 | 1 | 1 | 1 | 1 | 1 | 1 | 1 | 1 | 1 | 1 | 1 | 1 | 1 | 1 |
| Step | Drying temperature (° C.) | 90 | 30 | 90 | 50 | 30 | 90 | 50 | 30 | 90 | 30 | 90 | 50 | 30 | 90 | 50 | 30 |
| | Thickness of solder particle-containing layer (μm) | 13 | 13 | 18 | 18 | 18 | 23 | 23 | 23 | 13 | 13 | 18 | 18 | 18 | 23 | 23 | 23 |
| Evaluation | Bridging | A | A | A | B | C | B | B | C | A | A | B | B | C | B | C | C |
| | Solder dewetting | A | A | A | A | A | A | A | A | A | A | A | A | A | A | A | A |

TABLE 3

| | | Example | | | | | | | | | | | | | | | |
|---|---|---|---|---|---|---|---|---|---|---|---|---|---|---|---|---|---|
| | Item | 33 | 34 | 35 | 36 | 37 | 38 | 39 | 40 | 41 | 42 | 43 | 44 | 45 | 46 | 47 | 48 |
| Composition | Solder particles B1 | 60 | 60 | 60 | 60 | 60 | 60 | 50 | 60 | — | — | — | — | — | — | — | — |
| (parts | Solder particles B2 | — | — | — | — | — | — | — | — | 60 | 60 | 60 | 60 | 60 | 60 | 60 | 50 |
| by mass) | Diethylene glycol | 40 | 40 | 40 | 40 | 40 | 40 | 40 | 40 | 40 | 40 | 40 | 40 | 40 | 40 | 40 | 40 |
| | Flux | 1 | 1 | 1 | 1 | 1 | 1 | 1 | 1 | 1 | 1 | 1 | 1 | 1 | 1 | 1 | 1 |

TABLE 3-continued

| | Item | Example | | | | | | | | | | | | | | | |
|---|---|---|---|---|---|---|---|---|---|---|---|---|---|---|---|---|---|
| | | 33 | 34 | 35 | 36 | 37 | 38 | 39 | 40 | 41 | 42 | 43 | 44 | 45 | 46 | 47 | 48 |
| Step | Drying temperature (° C.) | 90 | 30 | 90 | 50 | 30 | 90 | 50 | 30 | 90 | 30 | 90 | 50 | 30 | 90 | 50 | 30 |
| | Thickness of solder particle-containing layer (μm) | 13 | 13 | 18 | 18 | 18 | 23 | 23 | 23 | 13 | 13 | 18 | 18 | 18 | 23 | 23 | 23 |
| Evaluation | Bridging | A | A | A | A | A | A | A | A | A | A | B | B | C | B | C | C |
| | Solder dewetting | A | A | A | A | A | A | A | A | A | A | A | A | A | A | A | A |

TABLE 4

| | Item | Comparative Example | | | | | | | | | |
|---|---|---|---|---|---|---|---|---|---|---|---|
| | | 1 | 2 | 3 | 4 | 5 | 6 | 7 | 8 | 9 | 10 |
| Composition (parts by mass) | Solder particles A1 | 60 | 60 | 60 | 60 | 60 | — | — | — | — | — |
| | Solder particles A5 | — | — | — | — | — | 60 | 60 | 60 | 60 | 60 |
| | Diethylene glycol | 40 | 40 | 40 | 40 | 40 | 40 | 40 | 40 | 40 | 40 |
| | Flux | 0 | 0 | 0 | 0 | 0 | 1 | 1 | 1 | 1 | 1 |
| Step | Drying temperature (° C.) | 90 | 30 | 90 | 50 | 30 | 90 | 30 | 90 | 50 | 30 |
| | Thickness of solder particle-containing layer (μm) | 13 | 13 | 23 | 23 | 23 | 15 | 15 | 18 | 18 | 18 |
| Evaluation | Bridging | A | A | A | A | A | D | D | E | E | F |
| | Solder dewetting | F | E | E | D | D | A | A | A | A | A |

REFERENCE SIGNS LIST

1: member, 2: insulating base material, 3: electrode (first electrode), 4: base material, 5: resin film, 6: solder particle, 7: solder paste layer, 9: solder particle-containing layer, 11: solder bump, 15: member with solder bumps (first member), 21: second member, 23: second electrode, 30: connection structure.

The invention claimed is:

1. A method for forming solder bumps comprising:

applying a solder paste to a member having a plurality of electrodes, wherein the solder paste is applied on the plurality of electrodes as well as in spaces between the plurality of electrodes, and the solder paste comprises solder particles, a flux, and a volatile dispersion medium;

heating the member and the solder paste at a first temperature below a melting point of solder constituting the solder particles to volatilize the volatile dispersion medium in the solder paste, and forming a solder particle-containing layer on the member;

heating the member and the solder particle-containing layer at a second temperature equal to or higher than the melting point of the solder constituting the solder particles to melt the solder particles in the solder particle-containing layer, and forming solder bumps on the electrodes of the member; and removing, by cleaning, a residue of the solder particle-containing layer remaining between adjacent ones of the solder bumps, wherein the solder particles have an average particle size of 1.0 μm to 10 μm, and a content of the volatile dispersion medium in the solder paste is 30% by mass or more.

2. The method for forming solder bumps according to claim 1, wherein the solder constituting the solder particles has a melting point of 180° C. or lower.

3. The method for forming solder bumps according to claim 1, wherein a content of the solder particles is 50% by mass or less.

4. The method for forming solder bumps according to claim 1, wherein a content of the flux is 10 parts by mass or less with respect to 100 parts by mass of the solder particles.

5. The method for forming solder bumps according to claim 1, wherein the average particle size of the solder particles is equal to or less than one-third of the distance between adjacent electrodes among the plurality of electrodes.

6. The method for forming solder bumps according to claim 1, wherein the first temperature is 50° C. or higher.

7. The method for forming solder bumps according to claim 1, wherein the solder particle-containing layer has a thickness equal to or less than two-thirds of the distance between adjacent electrodes among the plurality of electrodes.

8. The method for forming solder bumps according to claim 1, wherein the member is a semiconductor substrate having the plurality of electrodes on a surface thereof.

9. A method for producing a member with solder bumps, the method comprising forming solder bumps by the method according to claim 1.

10. The method for forming solder bumps according to claim 1, wherein the step of heating the member and the solder particle-containing layer at the second temperature is conducted under an atmosphere being purged with nitrogen.

11. The method for forming solder bumps according to claim 1, wherein the flux is at least one selected from the group consisting of lactic acid, citric acid, stearic acid, glutamic acid, glutaric acid, succinic acid, adipic acid, pimelic acid, suberic acid, benzoic acid, and malic acid.

* * * * *